US009407839B2

(12) United States Patent
Yoshida

(10) Patent No.: US 9,407,839 B2
(45) Date of Patent: Aug. 2, 2016

(54) SOLID-STATE IMAGING DEVICE

(71) Applicant: CANON KABUSHIKI KAISHA, Tokyo (JP)

(72) Inventor: Daisuke Yoshida, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 288 days.

(21) Appl. No.: 13/909,240

(22) Filed: Jun. 4, 2013

(65) Prior Publication Data

US 2013/0341489 A1 Dec. 26, 2013

(30) Foreign Application Priority Data

Jun. 22, 2012 (JP) ................................. 2012-141462

(51) Int. Cl.
| | | |
|---|---|---|
| H01L 27/00 | (2006.01) | |
| H04N 5/335 | (2011.01) | |
| H03M 1/44 | (2006.01) | |
| H03M 1/34 | (2006.01) | |
| H04N 5/378 | (2011.01) | |
| H03M 1/12 | (2006.01) | |
| H03M 1/46 | (2006.01) | |
| H03M 1/56 | (2006.01) | |

(52) U.S. Cl.
CPC ........... *H04N 5/3355* (2013.01); *H03M 1/1225* (2013.01); *H03M 1/34* (2013.01); *H03M 1/44* (2013.01); *H03M 1/442* (2013.01); *H04N 5/378* (2013.01); *H03M 1/466* (2013.01); *H03M 1/56* (2013.01)

(58) Field of Classification Search
CPC ......... H03M 1/34; H03M 1/44; H03M 1/442; H03M 1/446; H03M 1/1225; H04N 5/3355; H04N 5/378

USPC ........................................ 250/208.1; 348/294
See application file for complete search history.

(56) References Cited

U.S. PATENT DOCUMENTS

| | | | |
|---|---|---|---|
| 8,400,546 B2 | 3/2013 | Itano et al. ..................... 348/308 |
| 8,587,466 B2 * | 11/2013 | Debnath et al. ............... 341/163 |
| 2003/0071748 A1 * | 4/2003 | Huang et al. .................. 341/155 |
| 2010/0060503 A1 * | 3/2010 | Sakakibara ............. H03M 1/20 |
| | | | 341/161 |

(Continued)

FOREIGN PATENT DOCUMENTS

| | | |
|---|---|---|
| CN | 102435818 A | 5/2012 |
| JP | 2012-54913 A | 3/2012 |

OTHER PUBLICATIONS

Dec. 25, 2015 Chinese Office Action corresponding to Chinese Patent Application No. 201310240109.8.

*Primary Examiner* — Georgia Y Epps
*Assistant Examiner* — Kevin Wyatt
(74) *Attorney, Agent, or Firm* — Fitzpatrick, Cella, Harper & Scinto

(57) ABSTRACT

A solid-state imaging device including an AD converter and a pixel array is provided. The AD converter performs a ramp comparison and a successive-approximation. The AD converter determines a digital value by performing one of the ramp comparison and the successive-approximation as a former comparison operation and then performing the other as a latter comparison operation in the range narrowed down by the former comparison operation. The pixel array supplies, to the AD converter, a reference signal corresponding to a reset level of the pixel, and an image signal having image information. The AD converter performs the latter comparison operation without performing the former comparison operation, when the reference signal is supplied.

15 Claims, 10 Drawing Sheets

(56) References Cited

U.S. PATENT DOCUMENTS

| | | | | |
|---|---|---|---|---|
| 2011/0013046 A1* | 1/2011 | Hiyama | H03M 1/06 | |
| | | | 348/222.1 | |
| 2011/0025895 A1* | 2/2011 | Hasegawa | 348/294 | |
| 2011/0080512 A1* | 4/2011 | Ay | 348/308 | |
| 2011/0309235 A1 | 12/2011 | Yoshida | 250/208.1 | |
| 2012/0025062 A1* | 2/2012 | Neubauer | H03M 1/145 | |
| | | | 250/208.1 | |
| 2012/0105262 A1 | 5/2012 | Rao et al. | | |
| 2012/0287316 A1* | 11/2012 | Kim | H04N 5/378 | |
| | | | 348/294 | |
| 2013/0206961 A1 | 8/2013 | Ikeda et al. | 250/208.1 | |

* cited by examiner

SOLID-STATE IMAGING DEVICE

BACKGROUND OF THE INVENTION

1. Field of the Invention

The present invention relates to a solid-state imaging device.

2. Description of the Related Art

In general, solid-state imaging devices used for digital cameras or digital video include an AD converter to convert an image signal of analog values to digital values. Various types of AD converters are known, and one type of them is a ramp-type AD converter. In a ramp-type AD converter, relative magnitudes of an input analog signal and a ramp signal are compared using a comparator, and a period from the time when the ramp signal starts to change until the time when the output of the comparator inverts is measured to determine the digital value. Although ramp-type AD converters can be configured with a small scale circuit, this is not suitable for a high speed operation because $2^{(n-1)}$ clock cycles are required to perform the AD conversion with n-bit resolution. Another AD converter type is referred to as a successive-approximation AD converter. Successive-approximation AD converters, which include a plurality of capacitors having binary weighted capacitance values, change a comparison signal using the capacitors, and continue to halve the range where the analog value is included. Although successive-approximation AD converters are suitable for high speed operation because n-bit resolution is realized in n clock cycles, their circuit scale becomes large because the capacitance ratio of the capacitors (i.e. area ratio) becomes $1:2^{(n-1)}$ at a maximum.

Considering the current situation, Japanese Patent Laid-Open No. 2012-54913 proposes a hybrid type AD converter. In the AD converter, a sub-range including the digital value is determined using a plurality of capacitors, and the digital value is determined from the sub-range by using a ramp signal.

SUMMARY OF THE INVENTION

In a configuration described in Japanese Patent Laid-Open No. 2012-54913, a noise reduced signal, which is obtained by performing a correlated double sampling on a signal output from a photo-diode, is converted to a digital signal by an AD converter. However, in the method described in the Japanese Patent Laid-Open No. 2012-54913, since a digital signal is obtained, in which an offset component of the AD converter itself is superimposed, accuracy of the AD conversion may not be good enough. Therefore, an aspect of the present invention is to provide a technique which is beneficial for providing a high-speed and highly accurate AD converter.

An aspect of the present invention provides a solid-state imaging device comprising an AD converter configured to convert an analog value to a digital value, and a pixel array having a plurality of pixels configured to supply an analog signal to the AD converter, wherein the AD converter comprises: a generation circuit including a plurality of capacitors having binary weighted capacitance values, and a switch circuit configured to select at least one of the capacitors from the plurality of capacitors, the generation circuit being configured to generate a comparison signal according to a composite capacitance value of the at least one of the capacitors selected by the switch circuit; a comparator circuit configured to compare the analog value and the value of the comparison signal; a control circuit configured to perform a first comparison operation to narrow down a range including the analog value by performing a binary search, in which a value of the comparison signal is changed by changing the composite capacitance value based on a comparison result of the comparator circuit, and to perform a second comparison operation to narrow down a range including the analog value based on a comparison result of the comparator circuit during a period when the comparison signal is changed at a constant rate, wherein the control circuit determines the digital value by performing one of the first comparison operation and the second comparison operation as a former comparison operation and then performing the other of the first comparison operation and the second comparison operation as a latter comparison operation in the range narrowed down by the former comparison operation, and the pixel array supplies, to the AD converter, a reference signal corresponding to a reset level of the pixel, and an image signal having image information, and the AD converter is configured to perform the latter comparison operation without performing the former comparison operation, when the reference signal is supplied.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Figure 1:
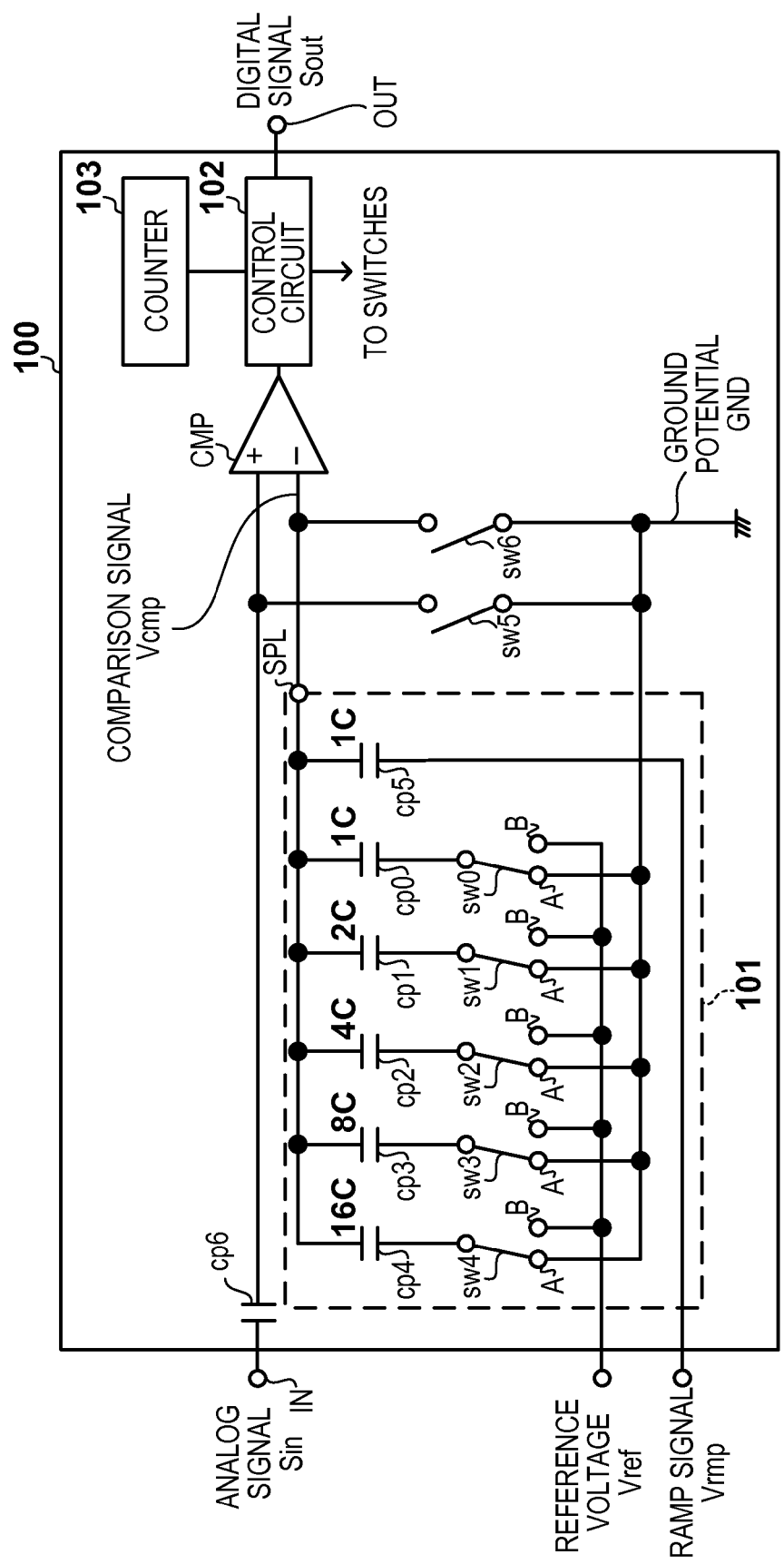
FIG. 1 is a diagram illustrating an exemplary configuration of an AD converter according to an embodiment of the present invention.

An exemplary embodiment of the present invention will be described in detail with reference to the accompanying drawings. Note that in the various embodiments, identical or corresponding elements are given the same reference numerals in the drawings, and descriptions thereof will not be repeated. Also a modification and a combination of each embodiment are possible, if appropriate.

Referring to FIG. 1, an exemplary circuit configuration of an AD converter 100 according to an embodiment of the present invention will be described. The AD converter 100 has an input terminal IN and an output terminal OUT, converts an analog signal Sin input from the input terminal IN to a digital signal Sout, and outputs the digital signal Sout from the output terminal OUT. The AD converter 100 converts the analog signal Sin to the digital signal Sout with 14-bit resolution. In other words, one of the integer numbers (digital value) that are at least 0 and no larger than $2^{14}-1$, corresponding to a value of the analog signal Sin (analog value), is output as the digital signal Sout.

The AD converter 100 further includes a generation circuit 101 to generate a comparison signal that is used for a comparison with the analog signal Sin. The generation circuit 101 includes a plurality of capacitors cp0 to cp4 having binary weighted capacitance values, and a plurality of switches sw0 to sw4 respectively connected to the capacitors cp0 to cp4. A switch circuit is configured where the plurality of switches sw0 to sw4 select one or more than one of the capacitors cp0 to cp4. A binary weight means a set of weights (capacitance values) that form a geometric progression of common ratio 2. In the example in FIG. 1, the capacitors cp0 to cp4 have capacitance values of 1C, 2C, 4C, 8C, 16C in that order. One electrode of each of the capacitors cp0 to cp4 is connected to a supply terminal SPL of the generation circuit 101, and the other electrodes are respectively connected to the switches sw0 to sw4. One electrode of each of the switches sw0 to sw4 is connected to the capacitors cp0 to cp4, respectively, and the other electrode of each of the switches is toggled between a terminal A and a terminal B. The terminal A is supplied with a ground potential GND, and the terminal B is supplied with a reference voltage Vref. The reference voltage Vref is a constant voltage supplied from outside to the AD converter 100, and is larger than the ground potential GND. When the switch sw0 is toggled to the terminal A, the ground potential GND is supplied to the capacitor cp0, and when the switch sw0 is toggled to the terminal B, the reference voltage Vref is supplied to the capacitor cp0. The other switches sw1-sw4 function similarly. By switching among the switches sw0 to sw4, a composite capacitance value of the capacitors connected between the supply terminal SPL and the reference voltage Vref changes, and the value of the comparison signal Vcmp output from the supply terminal SPL changes as a result.

The supply terminal SPL of the generation circuit 101 is further supplied with a ramp signal Vrmp from outside the AD converter 100 through a capacitor cp5. The capacitor cp5 is a capacitor to adjust the magnitude of the ramp signal Vrmp, and has a capacitance value of 1C. In other words, the capacitance value of the capacitor cp5 is equal to the minimum capacitance value of the group of capacitors cp0 to cp4 having binary weighted capacitance values. The value of the comparison signal Vcmp output from the supply terminal SPL changes also according to the change of the value of the ramp signal Vrmp.

By combining the set of capacitors connected between the supply terminal SPL and the reference voltage Vref with the value of the ramp signal Vrmp, the comparison signal Vcmp can have any value of at least the ground potential GND and at most the reference voltage Vref.

The AD converter 100 further includes a comparator CMP. The comparator CMP compares the value of the analog signal Sin with the value of the comparison signal Vcmp, and outputs a signal according to the comparison result. A non-inverting terminal of the comparator CMP is supplied with the analog signal Sin through a capacitor cp6, and an inverting terminal of the comparator CMP is supplied with the comparison signal Vcmp from the supply terminal SPL of the generation circuit 101. Accordingly, if the value of the analog signal Sin is at least the value of the comparison signal Vcmp, High is output, and if the value of the analog signal Sin is less than the value of the comparison signal Vcmp, Low is output. Although, in this example, High is output if the value of the analog signal Sin is equal to the value of the comparison signal Vcmp, Low may be output instead. The capacitor cp6 adjusts the value of the analog signal Sin to a range where the comparison with the comparison signal Vcmp is possible. For the sake of simplifying explanations, this embodiments handles a case in which the value of the analog signal Sin is at least the ground potential GND and not larger than the reference voltage Vref, and a signal having the same magnitude as the analog signal Sin is supplied to the non-inverting terminal of the comparator CMP.

In the example in FIG. 1, although the analog signal Sin is supplied to the non-inverting terminal of the comparator CMP, and the comparison signal Vcmp is supplied to the inverting terminal of the comparator CMP, other configurations may be possible as long as the magnitude comparison between the value of the analog signal Sin and the value of the comparison signal Vcmp is possible. For example, a difference between the analog signal Sin and the comparison signal Vcmp may be supplied to the non-inverting terminal of the comparator CMP, and the ground potential GND may be supplied to the inverting terminal of the comparator CMP.

The AD converter 100 further includes switches sw5 and sw6. When these switches sw5 and sw6 are made conductive, the ground potential GND is supplied to the non-inverting terminal and the inverting terminal of the comparator CMP, and the comparator CMP is reset.

The comparator CMP further includes a control circuit 102 and a counter 103. The control circuit 102 is supplied with a comparison result from the comparator CMP. The control circuit 102 generates a digital signal Sout based on the comparison result, and outputs the digital signal Sout from an output terminal OUT. The control circuit 102 also sends control signals to the switches sw0 to sw6 to switch their state. The counter 103 starts counting following an instruction from the control circuit 102, and returns the current count value to the control circuit 102 following a subsequent instruction by the control circuit 102.

Figure 2:
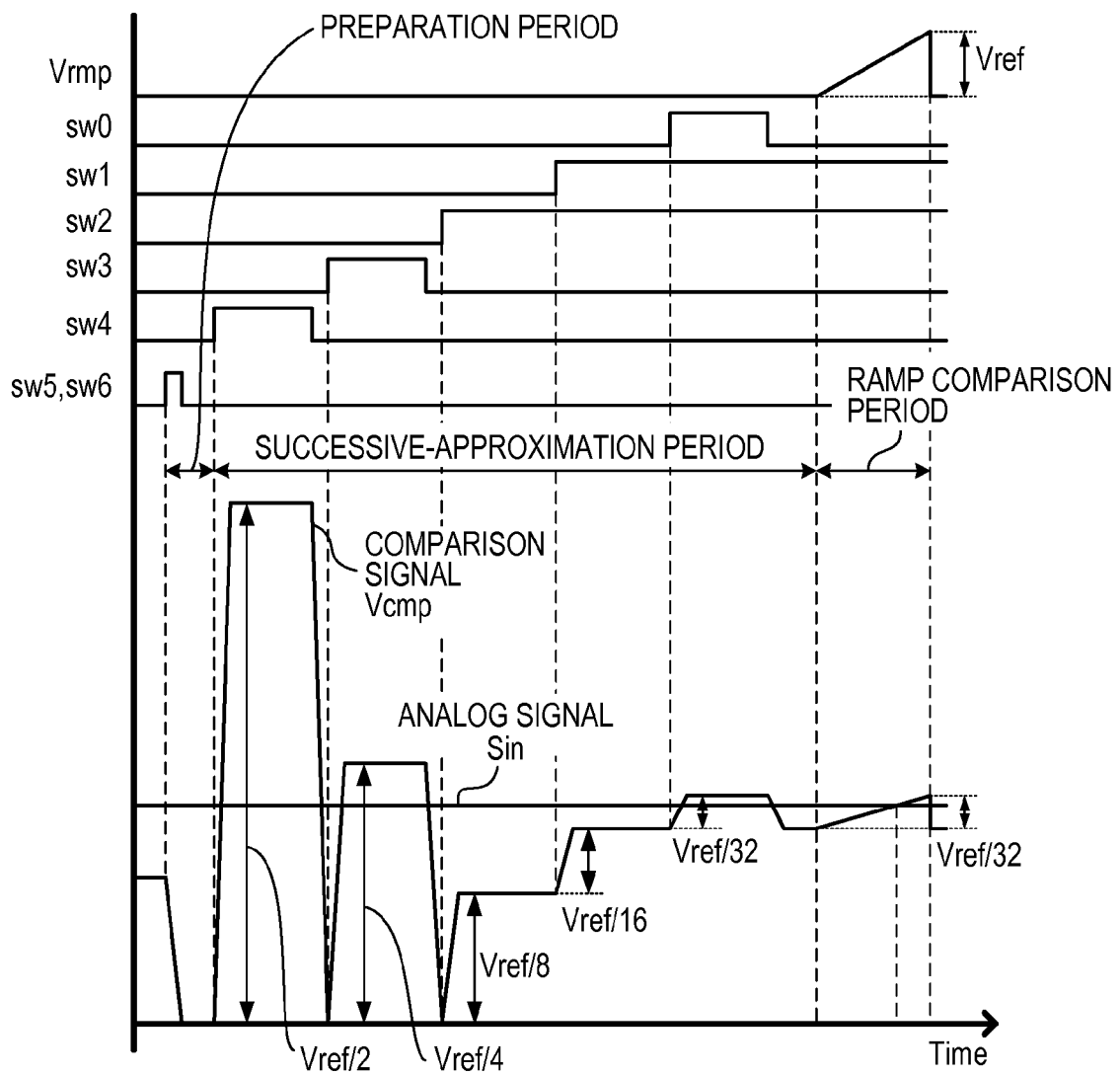
FIG. 2 is a diagram illustrating an operating principle of the AD converter in FIG. 1.

Next, referring to a timing chart in FIG. 2, a principle of an AD conversion operation by the AD converter 100 will be described. The AD converter 100 executes a first comparison operation (hereinafter referred to as "successive approximation"), in which a binary search is performed by changing the comparison signal Vcmp using the capacitors cp0 to cp4 in a successive-approximation period (first period), and determines the upper five bits of the digital signal Sout. Next, the AD converter 100 executes a second comparison operation (hereinafter referred to as "ramp comparison"), in which a comparison with the analog signal Sin is performed by changing the comparison signal Vcmp using the ramp signal Vrmp in a ramp comparison period (second period), and determines the lower nine bits of the digital signal Sout. In FIG. 2, Vrmp represents a value of the ramp signal Vrmp. The value of the ramp signal Vrmp is equal to the ground potential GND until the ramp comparison period starts, and monotonously changes until it becomes equal to the reference voltage Vref in the ramp comparison period. In the example in FIG. 2, the value of the ramp signal Vrmp increases at a fixed rate, in other words, it increases by an equal value at every unit time. In the AD converter 100, the value of the ramp signal Vrmp increases by $Vref/2^9$ at every clock cycle. Accordingly, the AD converter 100 can perform the comparison between the analog signal Sin and the comparison signal Vcmp in the ramp comparison period with 9-bit resolution. In other words, since the control circuit 102 can narrow down the range that includes the value of the analog signal Sin to the range having a width of $Vref/2^9$ by the ramp comparison, it determines a digital value corresponding to that range.

In this embodiment, the change amount of the ramp signal Vrmp is equal to the reference voltage Vref. By supplying such a ramp signal Vrmp to the AD converter 100, the capacitance value of the capacitor cp5 which is supplied with the ramp signal Vrmp can be set such that its ratio to the capacitance values of the binary weights becomes an integer. In a monolithic IC, capacitors with weights (capacitance value) having a ratio of an integer number can be easily configured, so that the configuration of the AD converter 100 is advantageous because the change amount of the comparison signal Vcmp in the ramp comparison can be set with just the capacitance value of the capacitor cp5.

In FIG. 2, sw0 to sw6 represent the value of control signals supplied to the switches sw0 to sw6 by the control circuit 102. The switches sw0 to sw4 are toggled to the terminal B when the control signal that is supplied is High, and are toggled to the terminal A when the control signal is Low. The switches sw5 and sw6 are made conductive when the supplied control signal is High, and made non-conductive when the control signal is Low. In the lower part of FIG. 2, the analog signal Sin and the comparison signal Vcmp are shown. In FIG. 2, a case in which the value of the analog signal Sin corresponds to a digital value 3382 in decimal (00 1101 0011 0110, in binary), is given as an example.

Next, an AD-conversion operation of the AD converter 100 will be described in chronological order. In a preparation period, the control circuit 102 sets the control signals supplied to the switches sw0 to sw4 to Low, and sets the control signals supplied to the switches sw5 and sw6 to High. Accordingly, the non-inverting terminal and the inverting terminal of the comparator CMP are reset to the ground potential GND, and the value of the comparison signal Vcmp is made equal to the ground potential GND. After that, the control circuit 102 sets the control signals supplied to the switches sw5 and sw6 to Low. In the following operation, the non-inverting terminal of the comparator CMP continues to be supplied with the analog signal Sin.

Next, when the successive-approximation period starts, the control circuit 102 changes the control signal supplied to the switch sw4 to High. Accordingly, the switch sw4 is toggled to the terminal B, and the supply terminal SPL of the generation circuit 101 is supplied with the reference voltage Vref through the capacitor cp4 having the largest capacitance value among the binary weights. As a result, the comparison signal Vcmp increases by Vref/2 and the value of the comparison signal Vcmp becomes equal to Vref/2. The control circuit 102 determines that the value of the analog signal Sin is less than the value of the comparison signal Vcmp (Vref/2) based on the comparison result by the comparator CMP, and sets the control signal supplied to the switch sw4 back to Low. As a result, the value of the comparison signal Vcmp returns to the ground potential GND. This comparison result means that the MSB (the 13-th bit from the LSB, if the LSB is assumed to be the 0-th bit) of the digital signal Sout is 0.

Next, the control circuit 102 changes the control signal supplied to the switch sw3 to High. Accordingly, the supply terminal SPL of the generation circuit 101 is supplied with the reference voltage Vref through the capacitor cp3 having the second largest capacitance value among the binary weights. As a result, the comparison signal Vcmp increases by Vref/4 and the value of the comparison signal Vcmp becomes equal to Vref/4. The control circuit 102 determines that the value of the analog signal Sin is less than the value of the comparison signal Vcmp (Vref/4) based on the comparison result by the comparator CMP, and sets the control signal supplied to the switch sw3 back to Low. As a result, the value of the comparison signal Vcmp returns to the ground potential GND. This comparison result means that the 12-th bit of the digital signal Sout is 0.

Next, the control circuit 102 changes the control signal supplied to the switch sw2 to High. Accordingly, the supply terminal SPL of the generation circuit 101 is supplied with the reference voltage Vref through the capacitor cp2 having the third largest capacitance value among the binary weights. As a result, the comparison signal Vcmp increases by Vref/8 and the value of the comparison signal Vcmp becomes equal to Vref/8. The control circuit 102 determines that the value of the analog signal Sin is larger than the value of the comparison signal Vcmp (Vref/8) based on the comparison result by the comparator CMP, and keeps the control signal supplied to the switch sw2 High. As a result, the value of the comparison signal Vcmp is kept at Vref/8. This comparison result means that the 11-th bit of the digital signal Sout is 1.

Next, the control circuit 102 changes the control signal supplied to the switch sw1 to High. Accordingly, the supply terminal SPL of the generation circuit 101 is supplied with the reference voltage Vref through the capacitors cp1 having the 4-th largest capacitance value among the binary weights, and cp2. As a result, the comparison signal Vcmp increases by Vref/16 and the value of the comparison signal Vcmp becomes equal to Vref*3/16. The control circuit 102 determines that the value of the analog signal Sin is larger than the value of the comparison signal Vcmp (Vref*3/16) based on the comparison result by the comparator CMP, and keeps the control signal supplied to the switch sw1 High. As a result, the value of the comparison signal Vcmp is kept at Vref*3/16. This comparison result means that the 10-th bit of the digital signal Sout is 1.

Finally, the control circuit 102 changes the control signal supplied to the switch sw0 to High. Accordingly, the supply terminal SPL of the generation circuit 101 is supplied with the reference voltage Vref through the capacitors cp0 having the 5-th largest capacitance value among the binary weights, cp1 and cp2. As a result, the comparison signal Vcmp increases by Vref/32 and the value of the comparison signal Vcmp becomes equal to Vref*7/32. The control circuit 102 determines that the value of the analog signal Sin is less than the value of the comparison signal Vcmp (Vref*7/32) based on the comparison result by the comparator CMP, and returns the control signal supplied to the switch sw0 to Low. As a result, the value of the comparison signal Vcmp returns to Vref*3/16. This comparison result means that the 9-th bit of the digital signal Sout is 0.

As the result of the successive-approximation described above, the control circuit 102 can narrow down the range that includes the value of the analog signal Sin to the range between at least Vref*3/16 and less than Vref*7/32. As a result, the control circuit 102 determines that the upper bits of the digital signal Sout are 00110. In other words, the control circuit 102 specifies that the value of the digital signal Sout is included in the range which is at least 00 1100 0000 0000, and not more than 00 1101 1111 1111, in binary. Thus, in the ramp comparison performed successively, the AD converter 100 determines the value of the digital signal Sout from the narrowed down range.

When the ramp comparison starts, the ramp signal Vrmp starts increasing. The control circuit 102 causes the counter 103 to start counting from the start of the increase of the ramp signal Vrmp. A supply source of the ramp signal Vrmp may start increasing the ramp signal Vrmp in response to a request from the control circuit 102, or may start at a predetermined timing without receiving the request. While the ramp signal Vrmp changes from the ground potential GND to the reference voltage Vref, the value of the comparison signal Vcmp also changes from Vref*3/16 to Vref*7/32. The control circuit 102 obtains a count value from the counter 103 when the output from the comparator CMP inverted. This count value corresponds to the value that results from subtracting Vref*3/16 from the value of the analog signal Sin, and in the example in FIG. 2, it is 1 0011 0110 (in binary). The value coincides with the lower bits of the digital signal Sout. The control circuit 102 can further narrow down the range including the value of the analog signal Sin by the ramp comparison. The control circuit 102 acquires the digital value corresponding to the further narrowed down range, determines that the digital value, which corresponds to the value of the analog signal Sin, is 3382, and outputs this value from the output terminal OUT.

As described above, since the AD converter 100 determines the upper bits of the digital signal Sout by successive-approximation, the time required for an AD conversion can be reduced compared with an AD converter which determines all bits by ramp comparison. Also, since successive-approximation is performed using a set of capacitors having binary weighted capacitance values, the circuit scale for the successive-approximation can be reduced. Although the example described above relates to a case in which the ramp signal Vrmp increases monotonously, the ramp signal Vrmp may also decrease monotonously. In this case, the comparison signal Vcmp decreases monotonously from the upper limit to the lower limit of the range which is narrowed down by the successive-approximation.

Figure 8:
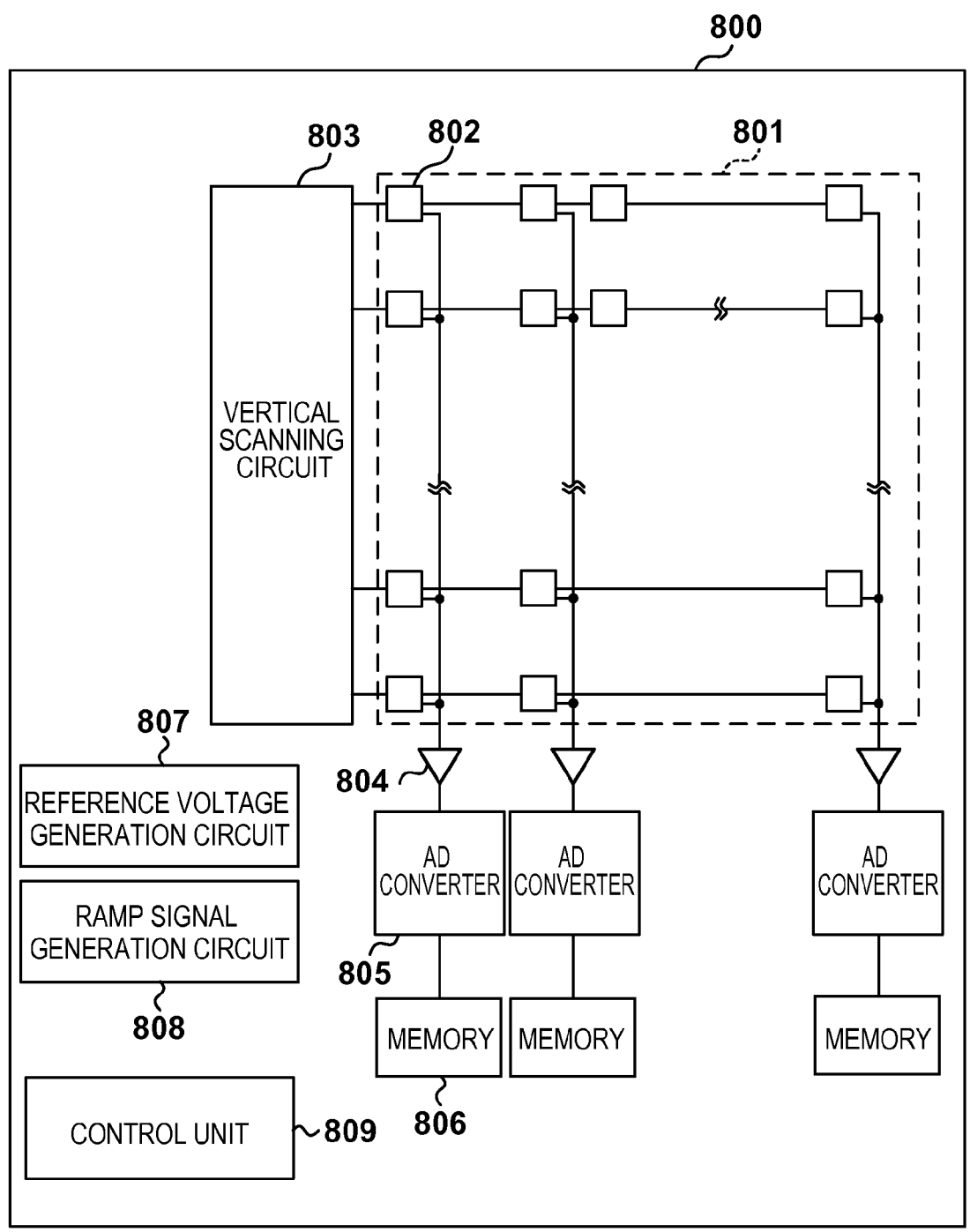
FIG. 8 is a diagram illustrating an exemplary configuration of a solid-state imaging device according to an embodiment of the present invention.

Next, referring to FIG. 8, an exemplary configuration of a solid-state imaging device 800 according to an embodiment will be described. The solid-state imaging device 800 may have the components shown in FIG. 8. A pixel array 801 is provided with a plurality of pixels 802 in an array. A vertical scanning circuit 803 scans the pixels 802 row by row and controls a timing to output a pixel signal to a vertical signal line shared by a column of pixels. An amplifier 804 amplifies a signal from the vertical signal line, and outputs it to an AD converter 805. The amplifier 804 is, for example, a variable gain amplifier. The AD converter 805 is one of the AD converters 100, 300, or 600 described in this specification. The AD converter 805 converts the analog pixel signal supplied by the amplifier 804 to a digital pixel signal and stores it in a memory 806. A reference voltage generation circuit 807 supplies a reference voltage Vref to the AD converter 805, and a ramp signal generation circuit 808 supplies a ramp signal Vrmp to the AD converter 805. A control unit 809 supplies clock signals and control signals to each of the components of the solid-state imaging device 800.

In the solid-state imaging device 800, the signal from the pixels 802 is output, in general, by a pixel amplifier such as a pixel source follower. In this case, the pixels 802 output a reference signal corresponding to a reset level of the pixels, and an image signal which includes image information after charges have been transferred from a photoelectric conversion element, as analog signals. In this embodiment, the AD converter 805 performs an AD-conversion on the reference signal and on the image signal, respectively, and obtains a difference between these two signals. In this manner, a CDS (correlated double sampling) operation to reduce a fixed-pattern noise specific to the pixels 802 is performed, and at the same time, a fixed-pattern noise specific to the AD converter 805 is reduced.

In the digital signal obtained by performing the AD-conversion on the reference signal, the fixed-pattern noise (offset) specific to the AD converter 805 is superimposed thereon. Similarly, in the digital signal obtained by performing the AD-conversion on the image signal, the offset specific to the AD converter 805 is superimposed thereon. Therefore, by taking the difference between these two digital signals, the fixed-pattern noise specific to the pixels and the fixed-pattern noise specific to the AD converter 805 can be reduced simultaneously.

The value of the reference signal is small compared with the value of the image signal. Therefore, the AD converter 805 performs the entire AD-conversion operation described above on the image signal, and omits a part of the AD-conversion operation on the reference signal. For example, let us assume that the AD converter 805 is the AD converter 100. When the AD converter 100 performs an AD-conversion on the reference signal, the control circuit 102 may omit the successive-approximation, and may perform only the ramp comparison. In particular, it is possible that the control circuit 102 does not perform the successive-approximation, and determines that the analog signal Sin is included in the minimum range narrowed down by the successive-approximation which is at least 0 and less than Vref/32, and the ramp comparison may be performed in this range. And after the completion of the ramp comparison, the control circuit 102 determines the digital value assuming that the upper bits decided by the successive-approximation are all 0s. Therefore the time required for the successive-approximation can be reduced. Also, the AD converter 100 may perform only a part of the successive-approximation process. For example, supposing preliminarily that the upper 3 bits determined by using the capacitors cp2-cp4 are 0s, the successive-approximation may be started from the 4-th most significant bit using the capacitor cp2. Which range of the reference signal is subjected to the AD-conversion may be designed as appropriate, depending on the characteristics of the pixels 802 or the like.

Furthermore, the case is considered that, if the AD converter 805 is the AD converter 100 and the AD-conversion is performed on the reference signal, the control circuit 102 omits the successive-approximation and performs only the ramp comparison. In addition, the counter 103 is assumed to have a switching function between an up-count and down-count. In this case, the control circuit 102 may cause the counter 103 to decrement when performing an AD-conversion on the reference signal, and may cause the counter 103 to increment when performing an AD-conversion on the image signal. Accordingly, as the digital image signal that is output from the AD converter 100, a value obtained by subtracting the reference signal is output. In this way, since the AD converter 100 performs the CDS function automatically, conversion errors of the AD converter caused by a variation of the capacitors or the like can be reduced, and the time to subtract the reference signal from the image signal is reduced, in addition.

Here, although an explanation is given for a solid-state imaging device as an example, there is no limitation to solid-state imaging devices, and an offset caused by the characteristics of the AD converter can be reduced, by subtracting an AD-conversion result of a reference signal supplied by a signal source, from an AD-conversion result of a signal in which a signal component is superimposed on the reference signal. In particular, in a configuration where an AD converter is provided for each column of pixels as in the solid-state imaging device 800, since a difference of offsets among AD converters appears as a stripe-shaped noise in an image acquired, it is effective to reduce the offset of the AD converter.

Next, an AD converter according to another embodiment of the present invention will be described. In the previous embodiment, an offset of the AD converter is reduced using a reference signal corresponding to a reset level of a pixel, and an image signal including image information after charges have been transferred from a photoelectric conversion element. In this embodiment, an offset of an AD converter is reduced by using an output from an amplifier. Here, a case in which, in the solid-state imaging device 800 in FIG. 8, the amplifier 804 is a capacitive feedback type amplifier will be described.

Figure 10:
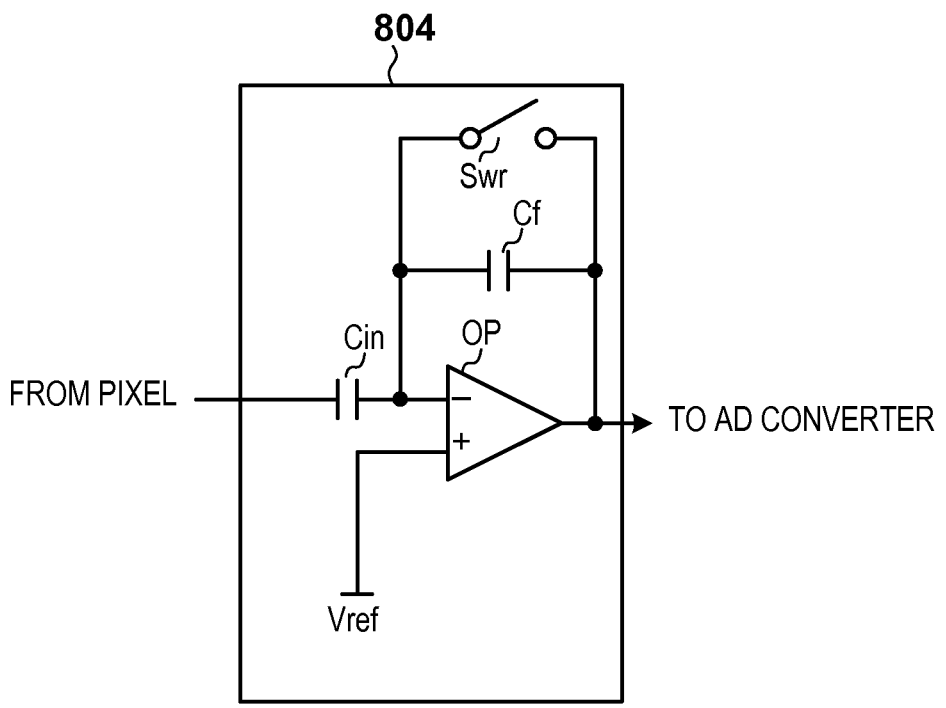
FIG. 10 is a diagram illustrating an exemplary configuration of an amplifier according to an embodiment of the present invention.

FIG. 10 shows an exemplary configuration of an amplifier according to the embodiment. In FIG. 10, the amplifier 804 includes an operational amplifier OP, an input capacitance Cin, a feedback capacitor Cf, and a reset switch Swr. A gain of the amplifier 804 can be made variable by making variable at least one of the capacitance values of the input capacitor Cin and the feedback capacitor Cf.

Figure 11:
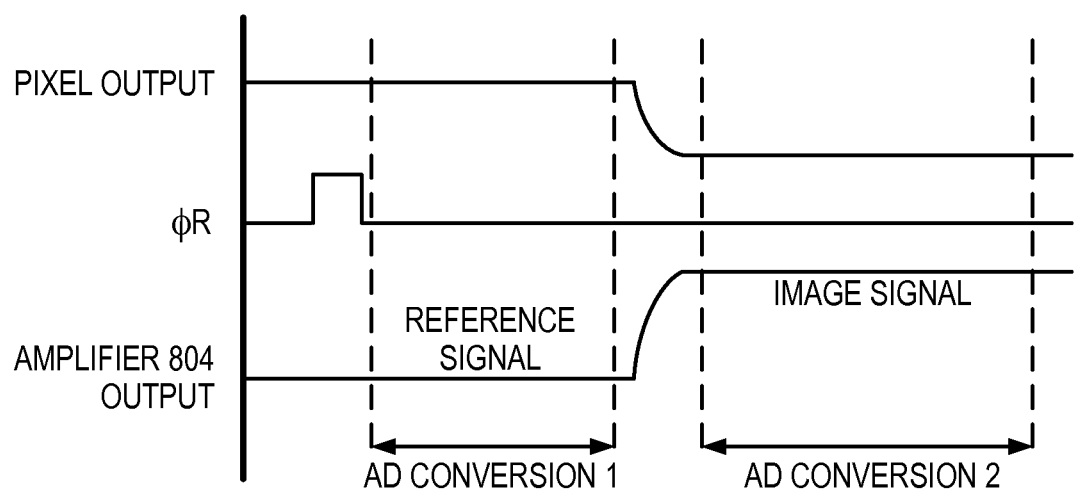
FIG. 11 is a diagram illustrating an exemplary operation of the amplifier in FIG. 10.

FIG. 11 is a timing chart illustrating an exemplary operation of the amplifier 804 in FIG. 10. First, a signal φR is set to High to turn on the reset switch Swr. Accordingly, both electrodes of the feedback capacitor Cf are reset to Vref. In this time period, a pixel signal for the case that a pixel is reset is input to the amplifier 804. Next, an AD-conversion is performed using the output of the amplifier 804 for the case that the signal φR is set to Low as a reference signal (AD-conversion 1).

After the completion of the AD-conversion performed on the reference signal, an image signal of the pixel is input to the amplifier 804. Accordingly, noise caused by the pixel is reduced by the input capacitance Cin, and an amplified image signal is output from the amplifier 804. An AD-conversion is performed on the output of the amplifier 804 as an image signal (AD-conversion 2).

Next, by taking a difference between the digital signal obtained in the AD-conversion 1 and the digital signal obtained in the AD-conversion 2, an offset specific to the AD converter can be reduced. The method of taking the difference may be one utilizing a counter which is capable of switching between an up-count and a down-count described in the above embodiment.

Figure 3:
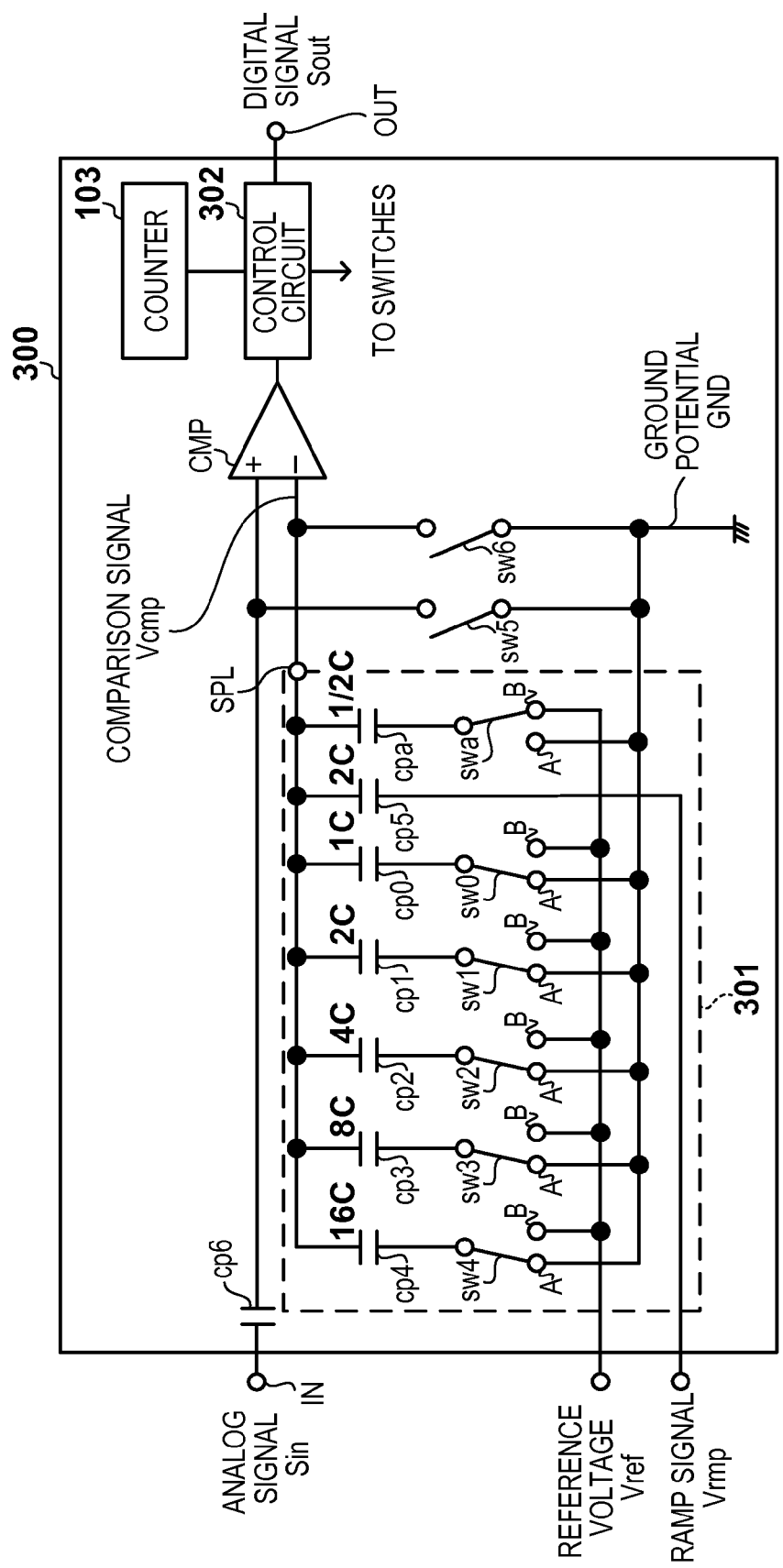
FIG. 3 is a diagram illustrating an exemplary configuration of an AD converter according to another embodiment of the present invention.

In the following, referring to FIG. 3, an exemplary circuit configuration of an AD converter 300 according to another embodiment will be described. The AD converter 300 is different from the AD converter 100 described above in the point that it has a generation circuit 301 and a control circuit 302 instead of the generation circuit 101 and the control circuit 102. In the following, the AD converter 300 is described focusing on the difference from the AD converter 100. The AD converter 300 converts an analog signal Sin to a digital signal Sout with 13-bit resolution. In other words, it outputs an integer number which is at least 0 and not more than $2^{13}-1$ as the digital signal Sout (digital value) corresponding to the value of the analog signal Sin (analog value). If an AD converter is operated at high speed, a comparator may misjudge due to insufficient settling or the like. The AD converter 300 according to the embodiment performs a correct AD-conversion even in a case where the comparator CMP has misjudged.

The generation circuit 301 further includes a capacitor cpa and a switch swa along with the components of the generation circuit 101. One of the electrodes of the capacitor cpa is connected to a supply terminal SPL of the generation circuit 301, and the other electrode is connected to the switch swa. One end of the switch swa is connected to the capacitor cpa, and the other end is toggled between a terminal A and a terminal B. A ground potential GND is supplied to the terminal A and a reference voltage Vref is supplied to the terminal B. When the switch swa is toggled to the terminal A, the ground potential GND is supplied to the capacitor cpa, and when the switch swa is toggled to the terminal B, the reference voltage Vref is supplied to the capacitor cpa. The capacitance value of the capacitor cpa is C/2. In other words, the capacitance value of the capacitor cpa is half the minimum capacitance value of the group of capacitors cp0 to cp4 having the binary weighted capacitance values. Furthermore, the capacitance value of the capacitor CP5 in the generation circuit 301 is 2C. In other words, the capacitance value of the capacitor cp5 is the same as the second smallest capacitance value of the group of capacitors cp0 to cp4 having the binary weighted capacitance values.

Figure 4:
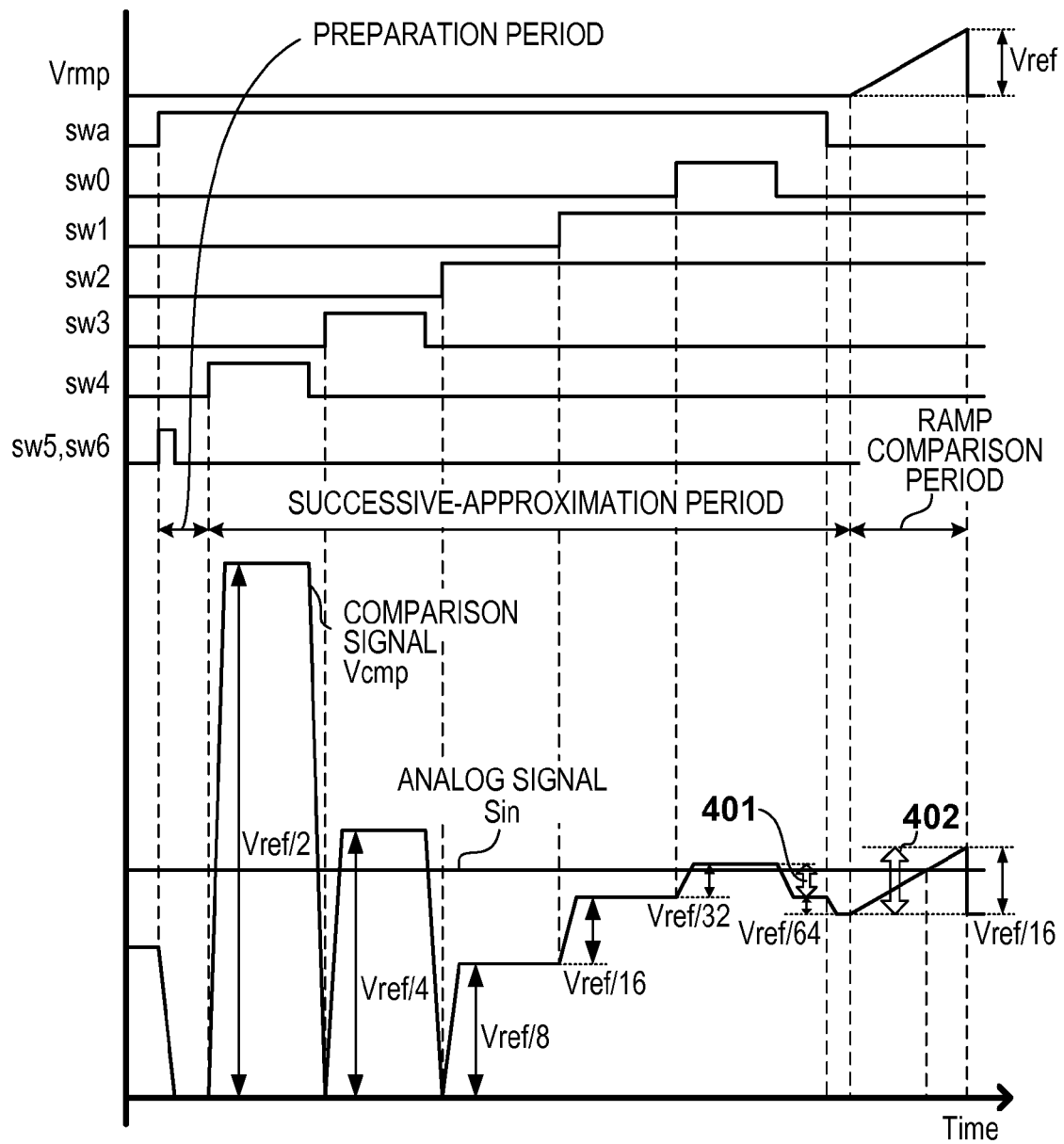
FIG. 4 is a diagram illustrating an exemplary operation of the AD converter in FIG. 3.
Figure 5:
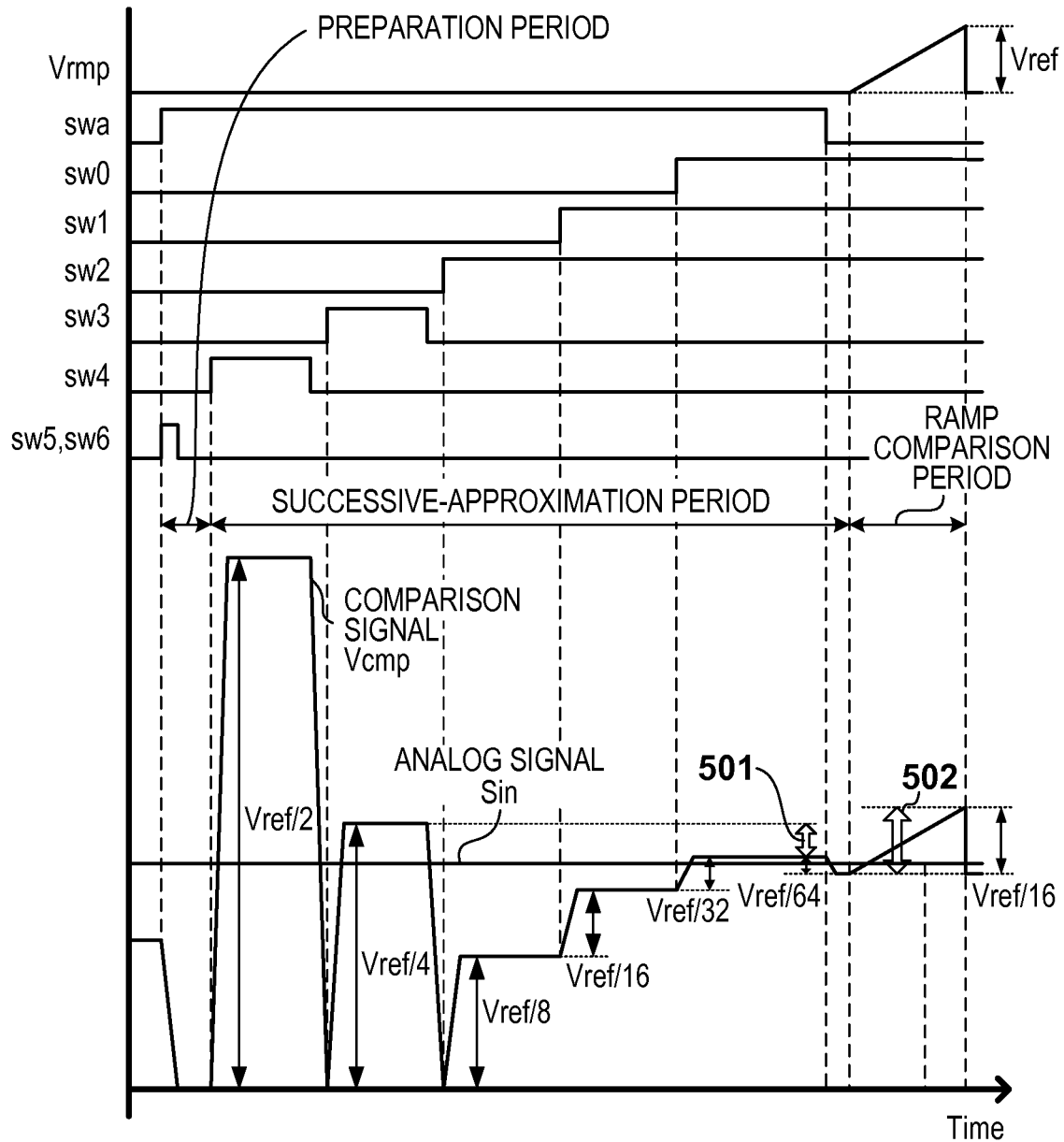
FIG. 5 is a diagram illustrating another exemplary operation of the AD converter in FIG. 3.

Next, referring to timing charts in FIGS. 4 and 5, an example of an AD-conversion operation by the AD converter 300 will be described. Also in FIGS. 4 and 5, like in FIG. 2, the value of the ramp signal Vrmp is equal to the ground potential GND until the ramp comparison period starts, and monotonously changes until it becomes equal to the reference voltage Vref in the ramp comparison period. Also, in the AD converter 300, the value of the ramp signal Vrmp increases by $Vref/2^9$ at every clock cycle. Accordingly, the AD converter 300 can perform the comparison in 9-bit resolution between the analog signal Sin and the comparison signal Vcmp in the ramp comparison period. In FIGS. 4 and 5, swa shows the value of a control signal supplied to the switch swa by the control circuit 302. The switch swa is toggled to the terminal B when the control signal that is supplied is High, and is toggled to the terminal A when the control signal is Low.

First, referring to FIG. 4, an example of a case where the comparator CMP does not misjudge will be described. In FIG. 4, a case in which the value of the analog signal Sin corresponds to a digital value 1718 in decimal (0 0110 1011 0110, in binary), is given as an example. In a preparation period, the control circuit 302 sets control signals supplied to the switches sw0 to sw4 to Low, and sets control signals supplied to the switch swa, sw5 and sw6 to High. Accordingly, the non-inverting terminal and the inverting terminal of the comparator CMP are reset to the ground potential GND, and the value of the comparison signal Vcmp is made equal to the ground potential GND. Next, the control circuit 302 sets the control signals supplied to the switches sw5 and sw6 to Low. In the following operations, the non-inverting terminal of the comparator CMP continues to be supplied with the analog signal Sin. Also, the control circuit 302 keeps the control signal supplied to the switch swa High in the successive-approximation period.

Next, the operation for the successive-approximation period is performed. Since the successive-approximation performed by the AD converter 300 is the same as that of the AD converter 100, its explanation will be omitted. After the completion of the successive-approximation, the control circuit 302 narrows down the range that includes the value of the analog signal Sin to the range between at least Vref*3/16 and less than Vref*7/32 (range designated by an arrow 401). In other words, the control circuit 302 determines the upper bits of the digital signal Sout to be 00110. However, if the comparator CMP misjudged in the successive-approximation, the value of the analog signal Sin may not be included in this range. Thus, the control circuit 302 performs a ramp comparison in a range that is larger than this range. In particular, it compares the value of the analog signal Sin with the value of the comparison signal Vcmp which changes in a range that is wider than the range determined by the successive-approximation by Vref/64 at the both ends, that is the range of at least Vref*11/64 and less than Vref*15/64 (range designated by an arrow 402). In other words, the control circuit 302 narrows down the value of the digital signal Sout, in order to correct the misjudgment, in the range of at least 0 0101 1000 0000 and no larger than 0 0111 0111 1111 in binary. In order to perform the comparison in this range, the control circuit 302 switches the control signal supplied to the switch swa to Low after the completion of the successive-approximation. As a result, the voltage supplied to the switch swa switches from the reference voltage Vref to the ground potential GND, and the comparison signal Vcmp is reduced by Vref/64 to Vref*11/64.

When the ramp comparison period starts, the comparison signal Vcmp increases from Vref*11/64 along with the increase of the ramp signal Vrmp. Since the capacitance value of the capacitor cp5 is 2C in the AD converter 300, when the ramp signal increases by Vref, the comparison signal Vcmp increases by Vref/16. Accordingly, the comparison signal Vcmp varies from Vref*11/64 to Vref*15/64 in the ramp comparison period. The count value when the output from the comparator CMP inverts corresponds to the value obtained by subtracting Vref*11/64 from the value of the analog signal Sin, and is 1 0011 0110 (binary), in the example in FIG. 4. Thus, the control circuit 302 determines the digital signal Sout by performing the following calculation.

digital value=(upper bits)*256−128+(lower bits)

Here, the upper bits are the value determined by the successive-approximation, and are 6 in decimal for the example in FIG. 4. "*256" means an operation of shifting the upper bits by 8 bits to the left. "128" corresponds to the value obtained by subtracting the value of the comparison signal Vcmp (Vref/64) after the completion of the successive-approximation. "lower bits" are determined by the ramp comparison, and are 310 in decimal in the example in FIG. 4. Accordingly, in the example in FIG. 4, 6*256−128+310=1718 is the determined digital value.

Next, referring to FIG. 5, an exemplary case in which the comparator CMP misjudged will be described. In FIG. 5, an exemplary case in which the value of the analog signal Sin corresponds to the digital value of 1718 in decimal (0 0110 1011 0110, in binary) will be described as in FIG. 4. Since the explanation for the preparation period is the same as that in FIG. 4, it will be omitted.

Let us assume that the comparator CMP misjudged when the control circuit 302 changed the control signal supplied to the switch sw0 to High in the successive-approximation. In other words, the comparator CMP outputs a reversed result even though the analog signal is less than the value of the comparison signal Vcmp (Vref*7/32). Accordingly, the control circuit 302 determines that the value of the analog signal Sin is larger than the value of the comparison signal Vcmp (Vref*7/32) based on the comparison result by the comparator CMP, and keeps the control signal supplied to the switch sw0 at High. Therefore, the value of the comparison signal Vcmp is kept at Vref*7/32. This comparison result means that the 10-th least significant bit of the digital signal Sout is 1.

After the completion of the successive-approximation, the control circuit 302 narrows down the range that includes the value of the analog signal Sin to the range between at least Vref*7/32 and less than Vref/4 (range designated by an arrow 501). In other words, the control circuit 302 determines the upper bits of the digital signal Sout to be 00111. However, since the comparator CMP misjudged in the successive-approximation, the value of the analog signal Sin is not included in this range. Since the control circuit 302 in the AD converter 300 according to this embodiment performs the ramp comparison in the range larger than this range, the misjudgment can be corrected. In particular, it compares the value of the analog signal Sin with the value of the comparison signal Vcmp which changes in the range wider than the range determined by the successive-approximation by Vref/64 at the both ends, that is, at least Vref*13/64 and less than Vref*17/64 (range designated by an arrow 502). In other words, the control circuit 302 narrows down the value of the digital signal Sout, in order to correct the misjudgment, in the range of at least 0 0110 1000 0000 and no larger than 0 1000 0111 1111 in binary. In order to perform the comparison in this range, the control circuit 302 switches the control signal supplied to the switch swa to Low after the completion of the successive-approximation. As a result, the voltage supplied to the switch swa switches from the reference voltage Vref to the ground potential GND, and the value of the comparison signal Vcmp is reduced by Vref/64 to Vref*13/64.

When the ramp comparison period starts, the comparison signal Vcmp increases from Vref*13/64 along with the increase of the ramp signal Vrmp. Since the capacitance value of the capacitor cp5 is 2C in the AD converter 300, when the ramp signal increases by Vref, the comparison signal Vcmp increases by Vref/16. Accordingly, the value of the comparison signal Vcmp varies from Vref*13/64 to Vref*17/64 in the ramp comparison period. The count value when the output from the comparator CMP inverts corresponds to the value obtained by subtracting Vref*13/64 from the value of the analog signal Sin, and is 0 0011 0110 (binary), in an example in FIG. 4. Thus, the control circuit 302 determines the digital signal Sout by performing the same calculation as described above, and 7*256−128+54=1718 is determined to be the digital value. This value is equal to the value when no misjudgment has occurred as described in FIG. 4.

As described above, the AD converter 300 has an advantage that it is capable of correcting a misjudge by the comparator CMP along with the advantages of the AD converter 100 described above. In the above example, the comparison range in the ramp comparison is set to be a range that is wider than the range determined by the successive-approximation by Vref/64 at the both ends. Accordingly, the AD converter 300 can accommodate misjudgments by the comparator CMP of errors less than Vref/64. Although errors in a wider range can be accommodated by making the comparison range wider in the ramp comparison, either the resolution of the AD-conversion is reduced or a longer time is required for the ramp comparison. Thus, the comparison range in the ramp comparison may be set to the double of the range narrowed down by the successive-approximation, as in the example described above, or may be set less than double. Also, although in the example described above, the comparison range is made wider by the same amount at the both ends, these two widths may be different, or only one of the upper side or the lower side may be widened.

Figure 6:
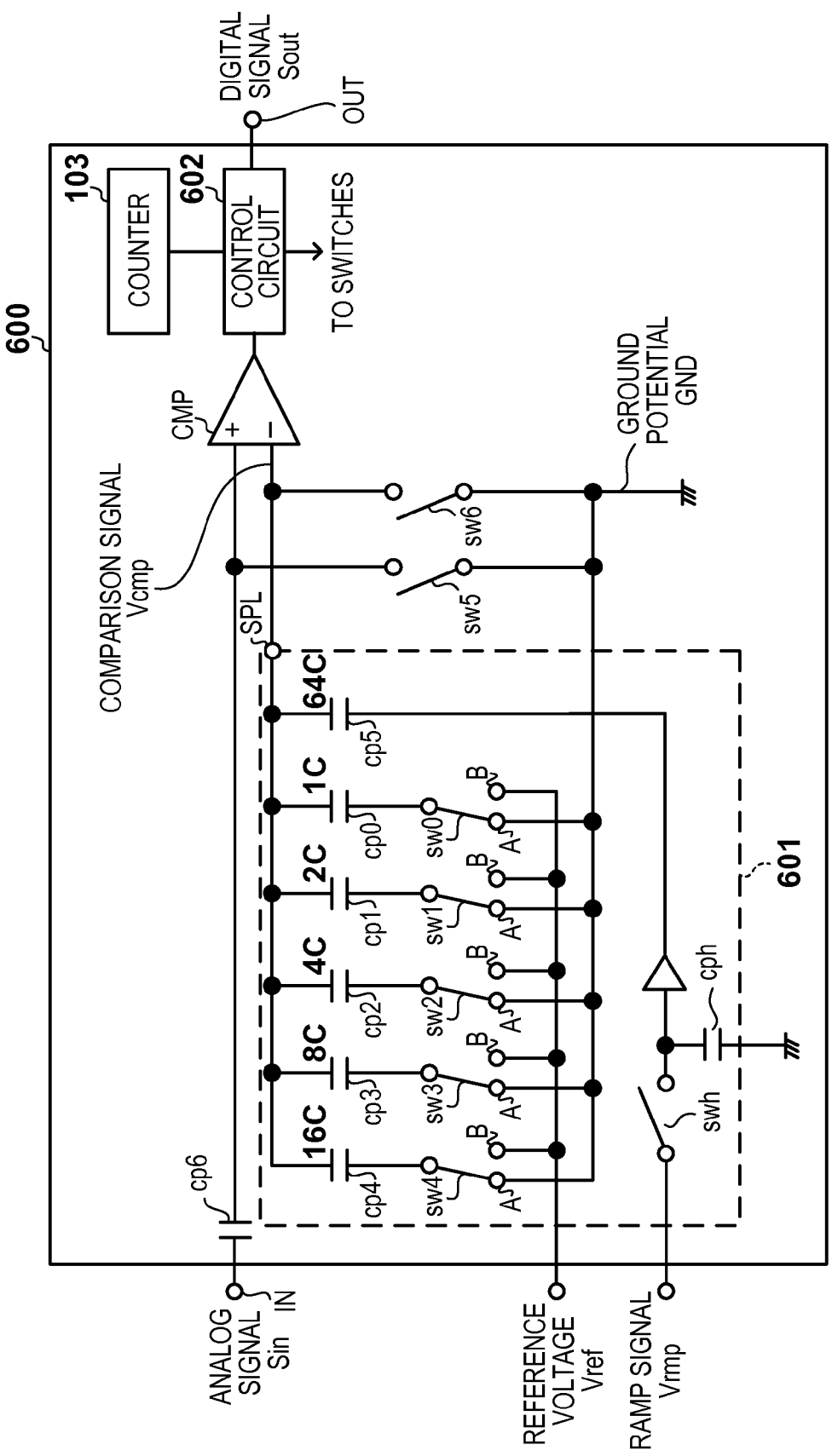
FIG. 6 is a diagram illustrating an exemplary configuration of an AD converter according to yet another embodiment of the present invention.

Next, referring to FIG. 6, an exemplary circuit configuration of an AD converter 600 according to another embodiment will be described. The AD converter 600 is different from the AD converter 100 described above in the point that it has a generation circuit 601 and a control circuit 602 instead of the generation circuit 101 and the control circuit 102. In the following, the AD converter 600 is described focusing on the difference from the AD converter 100. The AD converter 600 converts an analog signal Sin to an digital signal Sout of 9-bit resolution. In other words, it outputs an integer number which is at least 0 and not more than $2^9-1$ as the digital signal Sout (digital value) corresponding to the value of the analog signal Sin (analog value). The AD converter 600 performs the successive-approximation to determine the digital signal Sout after narrowing down the range which includes the value of the analog signal Sin by the ramp comparison.

The generation circuit 601 further includes a capacitor cph and a switch swh along with the components of the generation circuit 101. The switch swh is connected between the capacitor cp5 and the ramp signal Vrmp. One of the electrodes of the capacitor cph is connected to a node between the switch swh and the capacitor cp5, and the other electrode is supplied with the ground potential GND. The capacitance value of the capacitor cph is 64C. In other words, the capacitance value of the capacitor cph is four times larger than the maximum capacitance value of the group of capacitors cp0 to cp4 having the binary weighted capacitance values.

Figure 7:
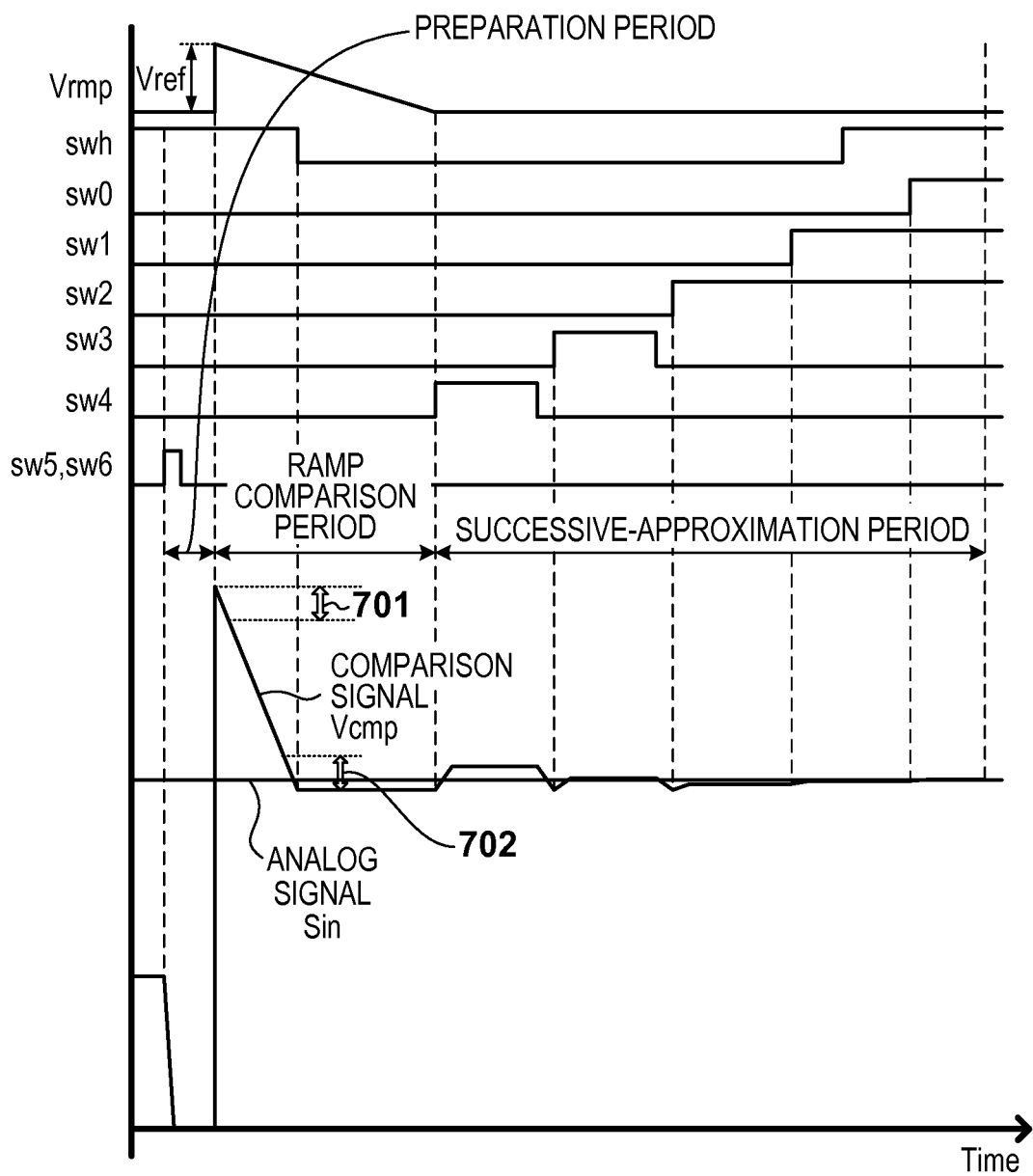
FIG. 7 is a diagram illustrating an exemplary operation of the AD converter in FIG. 7.

In the following, referring to timing chart in FIG. 7, an example of an AD-conversion operation by the AD converter 600 will be described. The value of the ramp signal Vrmp is equal to the ground potential GND until the ramp comparison period starts, and monotonously changes from the reference voltage Vref to the ground potential GND at a constant rate in the ramp comparison period. In the example in FIG. 7, the ramp signal Vrmp decreases linearly. In the AD converter 600, the value of the ramp signal Vrmp decreases by $Vref/2^4$ at every clock cycle. Accordingly, the AD converter 600 can perform the comparison between the analog signal Sin and the comparison signal Vcmp in the ramp comparison period with 4-bit resolution. As the result, the range including the value of the analog signal Sin can be narrowed down to the range with the width of $Vref/2^4$. In FIG. 7, swh indicates the value of a control signal supplied to the switch swh by the control circuit 602. The switch swh is made conductive when the control signal that is supplied is High, and is made non-conductive when the control signal is Low.

In the following, an AD-conversion operation of the AD converter 600 will be described in chronological order. In a preparation period, the control circuit 602 sets the control signals supplied to the switches sw0 to sw4 to Low, and sets the control signals supplied to the switches swh, sw5, and sw6 to High. Accordingly, the non-inverting terminal and the inverting terminal of the comparator CMP are reset to the ground potential GND, and the value of the comparison signal Vcmp is made equal to the ground potential GND. After that, the control circuit 602 sets the control signals supplied to the switches sw5 and sw6 to Low. In the following operation, the non-inverting terminal of the comparator CMP continues to be supplied with the analog signal Sin. Also, the control circuit 602 keeps the control signal supplied to the switch swh at High from the start of the ramp comparison period.

When the ramp comparison period starts, the ramp signal Vrmp start decreasing after it increased to Vref. The control circuit 602 causes the counter 103 to start counting from the start of the decrease of the ramp signal Vrmp. While the ramp signal Vrmp changes from the reference voltage Vref to the ground potential GND, the value of the comparison signal Vcmp decreases from the reference voltage Vref by Vref/16 (range designated by an arrow 701) at every clock cycle (at every unit time interval). The control circuit 602 obtains a count value from the counter 103 when the output from the comparator CMP is inverted, and switches the control signal supplied to the switch swh to Low. Accordingly, the value of the comparison signal Vcmp at this moment is sampled by the capacitor cph. The obtained count number corresponds to the upper bits of the digital signal Sout. Furthermore, the control circuit 602 can narrow down the range including the value of the analog signal Sin to the range designated by an arrow 702.

Therefore, in the subsequent successive-approximation, the control circuit 602 determines the lower bits of the digital signal Sout by performing the binary search using the capacitors cp0 to cp4.

As described above, also the AD converter 600, in a similar manner with the AD converter 100, can reduce the circuit scale for performing the successive-approximation, along with reducing the time required for the AD-conversion. Also, in a similar manner with the AD converter 300, the AD converter 600 may determine the value of the digital signal Sout by the successive-approximation after expanding the range narrowed down by the ramp comparison by adding the capacitor cpa and the switch swa. Accordingly, even in a case where the comparator CMP misjudges in the comparison between the value of the ramp signal Vrmp and the value of the analog signal Sin, the misjudgment is corrected in the subsequent successive-approximation.

Similar to the AD converters 100 or 300, The AD converter 600 can also be applied to a solid-state imaging device. In a case where the AD converter 600 performs AD-conversion on the reference signal, the control circuit 602 may skip the ramp comparison, and may perform only the successive-approximation. In particular, without performing the ramp comparison, the control circuit 602 may determine that the analog signal Sin is included in the minimum range narrowed down by the successive-approximation, that is, at least 0 and less than Vref/16. And, it may perform the successive-approximation in this range. The control circuit 602 then decides the digital value after the completion of the successive-approximation, assuming that the upper bits decided by the ramp comparison are all 0s. Accordingly, the time required for the successive-approximation can be reduced. Also, the AD converter 600 may perform part of the ramp comparison. For example, the monotonous decrease of the comparison signal Vcmp may start from Vref/4, and upper bits may be decided by the ramp comparison. In this case, the upper two bits of the digital value are assumed in advance to be 0.

Figure 9:
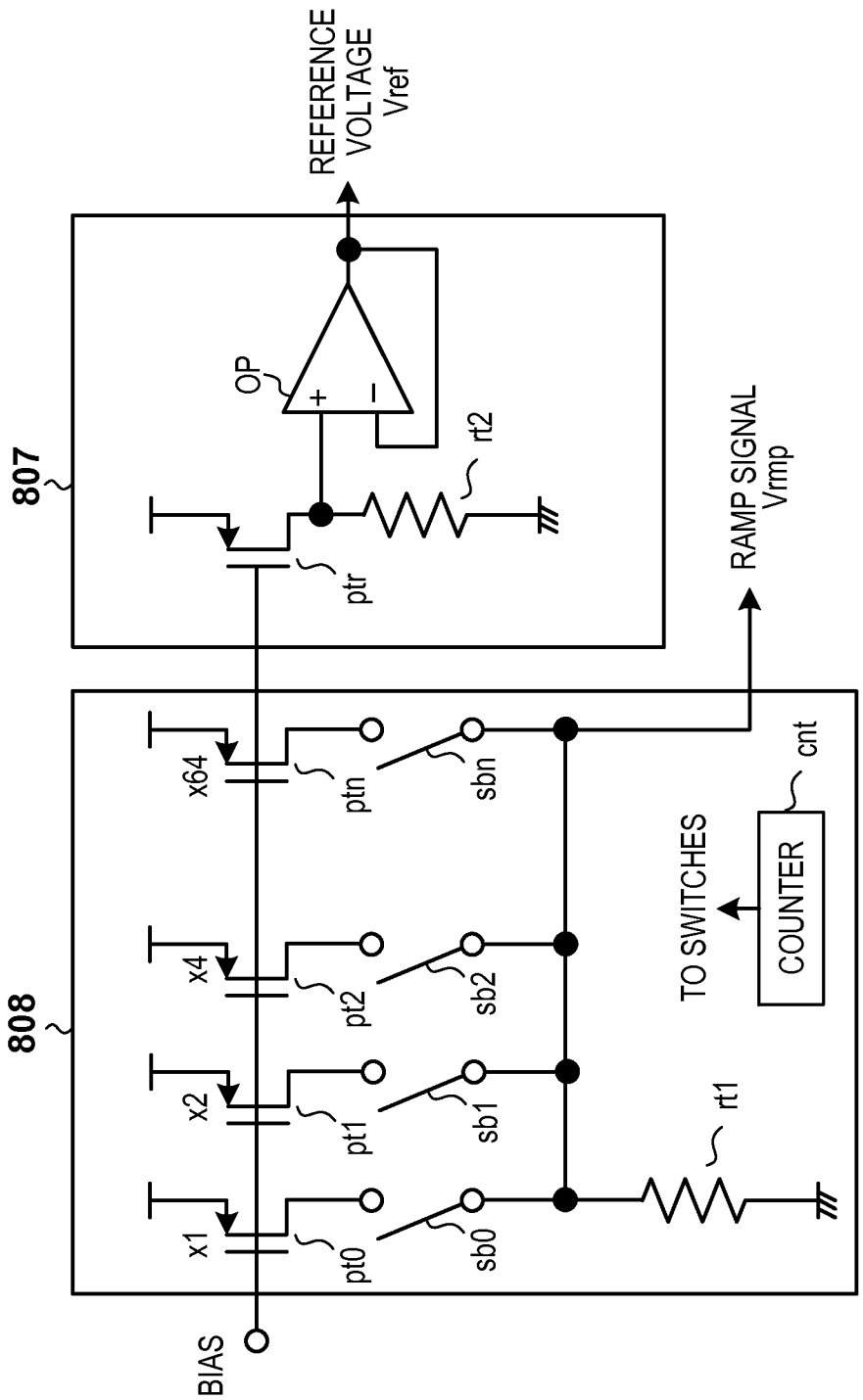
FIG. 9 is a diagram illustrating an exemplary configuration of various generation circuits according to an embodiment of the present invention.

Next, referring to FIG. 9, an exemplary circuit configuration of a reference voltage generation circuit 807 and a ramp signal generation circuit 808 will be described. As shown in FIG. 9, the ramp signal generation circuit 808 has a plurality of p-channel transistors pt0 to ptn having binary weighted drivabilities. Gates of the p-channel transistors pt0 to ptn are applied with a predetermined voltage BIAS from a bias block. The p-channel transistors pt0 to ptn are connected to a resistance element rt1 through respective switches sb0 to sbn. A current value flowing through the resistance element rt1 varies depending on the combination of switches sb0 to sbn that are made conductive. The current value is converted by the resistance element rt1 to a voltage, and this voltage is output as the ramp signal Vrmp. A ramp signal Vrmp which changes in time by a predetermined amount is generated by turning on and off the switches sb0 to sbn by a counter cnt.

The reference voltage generation circuit 807 has a p-channel transistor ptr and a resistance element rt2. The voltage BIAS is also applied to the p-channel transistor ptr, and the current flowing through the p-channel transistor ptr is converted to a voltage by the resistance element rt2, and this voltage is supplied to an operational amplifier OP. The operational amplifier OP acts as a voltage follower, and outputs the reference voltage Vref. By adjusting the weight of p-channel transistor ptr, a change amount (amplitude) of the ramp signal Vrmp can be made equal to the value of the reference voltage Vref.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-141462, filed Jun. 22, 2012, which is hereby incorporated by reference herein in its entirety.

What is claimed is:

1. A solid-state imaging device comprising an AD converter, and a plurality of pixels configured to supply an analog signal to the AD converter,
wherein the AD converter comprises:
a generation circuit including a plurality of capacitors having binary weighted capacitance values and a switch circuit configured to select at least one of the capacitors from the plurality of capacitors, the generation circuit being configured to generate a comparison signal according to a composite capacitance value of the at least one of the capacitors selected by the switch circuit;
a comparator circuit configured to compare the analog signal and the comparison signal;
a control circuit configured to perform a first comparison operation to narrow down a range including a value of the analog signal by performing a binary search, in which a value of the comparison signal is changed by changing the composite capacitance value based on a comparison result of the comparator circuit, and to perform a second comparison operation to narrow down a range including the value of the analog signal based on a comparison result of the comparator circuit during a period when the comparison signal is changed at a constant rate,
wherein the plurality of pixels supply, to the AD converter, a reference signal corresponding to a reset level of the pixel and an image signal having image information as the analog signals,
wherein the AD converter converts the reference signal and the image signal in different ways such that
when the image signal is supplied, the AD converter converts the image signal to a first digital signal by performing a first selected operation selected from the first comparison operation and the second comparison operation and then performing a second selected operation selected from the first comparison operation and the second comparison operation in the range narrowed down by the first operation, the second selected operation being different from the first selected operation, and
when the reference signal is supplied, the AD converter converts the reference signal to a second digital signal by performing the second selected operation without performing the first selected operation.

2. The device according to claim 1, wherein the AD converter starts the second selected operation from a range that is wider than the range which is narrowed down by the first selected operation.

3. The device according to claim 2, wherein the AD converter starts the second selected operation from a range having a width not more than double the range narrowed down by the first selected operation.

4. The device according to claim 1, wherein the first operation is the first selected comparison operation and the second selected operation is the second comparison operation.

5. The device according to claim 1, wherein the first selected operation is the second comparison operation and the second selected operation is the first comparison operation.

6. The device according to claim 1, wherein
the generation circuit generates the comparison signal by converting a reference voltage with the composite capacitance value, and changes the comparison signal by adding a ramp signal to the comparison signal, and
an amount of variance of the ramp signal, during the second comparison operation, is equal to the reference voltage.

7. A solid-state imaging device comprising an AD converter, and a plurality of pixels configured to supply an analog signal to the AD converter,
wherein the AD converter comprises:
a generation circuit including a plurality of capacitors having binary weighted capacitance values, and a switch circuit configured to select at least one of the capacitors from the plurality of capacitors, the generation circuit being configured to generate a comparison signal according to a composite capacitance value of the at least one of the capacitors selected by the switch circuit;
a comparator circuit configured to compare the analog signal and the comparison signal;
a control circuit configured to perform a first comparison operation of comparing the comparison signal with the analog signal while causing the switch circuit to change combination of the at least one of the capacitors based on a comparison result of the comparator circuit, and to perform a second comparison operation of comparing the comparison signal with the analog signal while changing the comparison signal based on a ramp signal input to the generation circuit
wherein the plurality of pixels supply, to the AD converter, a reference signal corresponding to a reset level of the pixel, and an image signal having image information as the analog signals,
wherein the AD converter converts the reference signal and the image signal in different ways such that
when the image signal is supplied, the AD converter converts the image signal to a first digital signal by performing a first selected operation selected from the first comparison operation and the second comparison operation and then performing a second selected operation selected from the first comparison operation and the second comparison operation in the range narrowed down by the first operation, the second selected operation being different from the first selected operation, and
when the reference signal is supplied, the AD converter converts the reference signal to a second digital signal by performing the second selected operation without performing the first selected operation.

8. The device according to claim 7, wherein the AD converter starts the second selected operation from a range that is wider than the range which is narrowed down by the first selected operation.

9. The device according to claim 8, wherein the AD converter starts the second selected operation from a range having a width not more than double the range narrowed down by the first selected operation.

10. The device according to claim 7, wherein the first selected operation is the first comparison operation and the second selected operation is the second comparison operation.

11. The device according to claim 7, wherein the first selected operation is the second comparison operation and the second selected operation is the first comparison operation.

12. The device according to claim 7, wherein the generation circuit generates the comparison signal by converting a reference voltage with the composite capacitance value, and changes the comparison signal by adding the ramp signal to the comparison signal, and an amount of variance of the ramp signal, during the second comparison operation, is equal to the reference voltage.

13. The device according to claim 7, wherein the generation circuit includes a capacitor configured to receive the ramp signal.

14. The device according to claim 13, wherein a capacitance value of the capacitor configured to receive the ramp signal is equal to one of the binary weighted capacitance values.

15. The device according to claim 13, wherein a capacitance value of the capacitor configured to receive the ramp signal is different from any one of the binary weighted capacitance values.

* * * * *